United States Patent
Lau et al.

(10) Patent No.: US 11,410,933 B2
(45) Date of Patent: Aug. 9, 2022

(54) PACKAGE STRUCTURE AND MANUFACTURING METHOD THEREOF

(71) Applicant: Unimicron Technology Corp., Taoyuan (TW)

(72) Inventors: John Hon-Shing Lau, Taoyuan (TW); Cheng-Ta Ko, Taipei (TW); Pu-Ju Lin, Hsinchu (TW); Tzyy-Jang Tseng, Taoyuan (TW); Ra-Min Tain, Hsinchu County (TW); Kai-Ming Yang, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/314,055

(22) Filed: May 7, 2021

(65) Prior Publication Data
US 2022/0108953 A1 Apr. 7, 2022

Related U.S. Application Data

(60) Provisional application No. 63/088,422, filed on Oct. 6, 2020.

(51) Int. Cl.
*H01L 21/00* (2006.01)
*H01L 23/538* (2006.01)
(Continued)

(52) U.S. Cl.
CPC ........ *H01L 23/5384* (2013.01); *H01L 21/486* (2013.01); *H01L 24/11* (2013.01);
(Continued)

(58) Field of Classification Search
CPC ..... H01L 23/5384; H01L 21/486; H01L 24/11
See application file for complete search history.

(56) References Cited

U.S. PATENT DOCUMENTS 10,699,996 B2 * 6/2020 Kim .................. H01L 23/49827
10,978,401 B2 * 4/2021 Lin ..................... H01L 23/5386
(Continued)

FOREIGN PATENT DOCUMENTS

EP 3848962 A2 * 7/2021 .......... H01L 21/568
TW I662676 6/2019
(Continued)

*Primary Examiner* — Laura M Menz
(74) *Attorney, Agent, or Firm* — JCIPRNET

(57) ABSTRACT

A package structure, including a bridge, an interposer, a first redistribution structure layer, a second redistribution structure layer, and multiple chips, is provided. The bridge includes a silicon substrate, a redistribution layer, and multiple bridge pads. The interposer includes an intermediate layer, multiple conductive vias, multiple first pads, and multiple second pads. The bridge is embedded in the intermediate layer. The bridge pads are aligned with the upper surface. The first redistribution structure layer is disposed on the upper surface of the interposer and is electrically connected to the first pads and the bridge pads. The second redistribution structure layer is disposed on the lower surface of the interposer and is electrically connected to the second pads. The chips are disposed on the first redistribution structure layer and are electrically connected to the first redistribution structure layer. The chips are electrically connected to each other through the bridge.

10 Claims, 4 Drawing Sheets

(51) Int. Cl.
*H01L 25/065* (2006.01)
*H01L 23/00* (2006.01)
*H01L 21/48* (2006.01)
*H01L 25/00* (2006.01)

(52) U.S. Cl.
CPC .............. *H01L 24/13* (2013.01); *H01L 24/14* (2013.01); *H01L 24/16* (2013.01); *H01L 25/0655* (2013.01); *H01L 25/50* (2013.01); *H01L 2224/13147* (2013.01); *H01L 2224/14505* (2013.01); *H01L 2224/16227* (2013.01)

(56) References Cited

U.S. PATENT DOCUMENTS

| | | | | |
|---|---|---|---|---|
| 11,309,253 | B2* | 4/2022 | Kao | H01L 23/5384 |
| 11,335,670 | B2* | 5/2022 | Chen | H01L 33/62 |
| 2013/0200515 | A1* | 8/2013 | Hwang | H01L 23/49811 257/737 |
| 2019/0043792 | A1* | 2/2019 | We | H01L 25/0652 |
| 2019/0051633 | A1* | 2/2019 | Bhagavat | H01L 23/5385 |
| 2019/0378795 | A1* | 12/2019 | Lee | H01L 24/20 |
| 2020/0105544 | A1* | 4/2020 | Tsai | H01L 21/4853 |
| 2020/0243450 | A1* | 7/2020 | Cho | H01L 23/49822 |
| 2020/0286847 | A1* | 9/2020 | Liu | H01L 24/19 |
| 2021/0111139 | A1* | 4/2021 | Fang | H01L 21/4857 |
| 2021/0183785 | A1* | 6/2021 | Kwon | H01L 24/20 |
| 2021/0257337 | A1* | 8/2021 | Park | H01L 24/19 |
| 2021/0335715 | A1* | 10/2021 | Kao | H01L 21/6835 |
| 2021/0335736 | A1* | 10/2021 | Kang | H01L 23/49838 |
| 2021/0407962 | A1* | 12/2021 | Kim | H01L 23/5384 |
| 2022/0068764 | A1* | 3/2022 | Lim | H01L 23/147 |
| 2022/0084993 | A1* | 3/2022 | Kim | H01L 23/562 |
| 2022/0093543 | A1* | 3/2022 | Seo | H01L 24/81 |
| 2022/0108935 | A1* | 4/2022 | Cho | H01L 25/18 |
| 2022/0108953 | A1* | 4/2022 | Lau | H01L 23/5385 |
| 2022/0115350 | A1* | 4/2022 | Mun | H01L 21/565 |
| 2022/0130752 | A1* | 4/2022 | Kim | H01L 23/49894 |
| 2022/0130788 | A1* | 4/2022 | Chen | H01L 23/5386 |
| 2022/0139874 | A1* | 5/2022 | Lee | H01L 25/0652 257/774 |
| 2022/0139880 | A1* | 5/2022 | Lee | H01L 25/0657 257/621 |

FOREIGN PATENT DOCUMENTS

| | | | | |
|---|---|---|---|---|
| TW | I670824 | | 9/2019 | |
| WO | WO-2019132970 | A1* | 7/2019 | ............. H01L 24/16 |

* cited by examiner

PACKAGE STRUCTURE AND MANUFACTURING METHOD THEREOF

CROSS-REFERENCE TO RELATED APPLICATION

This application claims the priority benefit of U.S. Provisional Application No. 63/088,422, filed on Oct. 6, 2020. The entirety of the above-mentioned patent application is hereby incorporated by reference herein and made a part of this specification.

BACKGROUND

Technical Field

The disclosure relates to a semiconductor structure and a manufacturing method thereof, and particularly relates to a package structure and a manufacturing method thereof.

Description of Related Art

The key to heterogeneous chiplet integration is the electrical connection between two chips. At present, Intel uses the embedded multi-die interconnect bridge (EMIB) to connect two chips, so as to achieve partial or local high-density interconnection. However, the issue encountered by the technology is that a bridge must be embedded in an organic substrate through the lamination technology, so the surface needs to be flat enough to perform the subsequent flip-chip packaging of the chips.

SUMMARY

The disclosure provides a package structure, which has better structural reliability, especially a flat surface for flip chip bonding.

The disclosure also provides a manufacturing method of a package structure, which is used to manufacture the package structure.

The package structure of the disclosure includes a bridge, an interposer, a first redistribution structure layer, a second redistribution structure layer, and multiple chips. The bridge includes a silicon substrate, a redistribution circuit layer, and multiple bridge pads. The redistribution circuit layer is disposed on the silicon substrate. The bridge pads are disposed on the redistribution circuit layer and are electrically connected to the redistribution circuit layer. The interposer includes an intermediate layer, multiple conductive vias, multiple first pads, and multiple second pads. The intermediate layer has an upper surface and a lower surface opposite to each other. The conductive vias penetrate the intermediate layer and are respectively connected to the first pads located on the upper surface and the second pads located on the lower surface. The bridge is embedded in the intermediate layer and the bridge pads are aligned with the upper surface. The first redistribution structure layer is disposed on the upper surface of the interposer and is electrically connected to the first pads and the bridge pads of the bridge. The second redistribution structure layer is disposed on the lower surface of the interposer and is electrically connected to the second pads. The chips are disposed on the first redistribution structure layer and are electrically connected to the first redistribution structure layer. The chips are electrically connected to each other through the bridge.

In an embodiment of the disclosure, the package structure further includes a multiple chip pads, which are disposed on the first redistribution structure layer and are electrically connected to the first redistribution structure layer. The chips are electrically connected to the first redistribution structure layer and the bridge through the chip pads.

In an embodiment of the disclosure, the package structure further includes multiple copper pillars, multiple solders, and multiple solder balls. The copper pillars are respectively disposed on the chips. The solders are respectively disposed on the copper pillars. The copper pillars are respectively located between the chips and the solders. The chips are electrically connected to the bridge through the copper pillars and the solders. The solder balls are disposed on the chips. The chips are electrically connected to the first redistribution structure layer through the solder balls.

In an embodiment of the disclosure, the package structure further includes multiple solder ball pads and multiple solder balls. The solder ball pads are disposed on the second redistribution structure layer and are electrically connected to the second redistribution structure layer. The solder balls are respectively disposed on the solder ball pads.

The manufacturing method of the package structure of the disclosure includes the following steps. A bridge is provided. The bridge includes a silicon substrate, a redistribution circuit layer, and multiple bridge pads. The redistribution circuit layer is disposed on the silicon substrate. The bridge pads are disposed on the redistribution circuit layer and are electrically connected to the redistribution circuit layer. The bridge is embedded in an interposer. The interposer includes an intermediate layer, multiple conductive vias, multiple first pads, and multiple second pads. The intermediate layer has an upper surface and a lower surface opposite to each other. The conductive vias penetrate the intermediate layer and are respectively connected to the first pads on the upper surface and the second pads on the lower surface. The bridge pads are aligned with the upper surface. A first redistribution structure layer is formed on the upper surface of the interposer. The first redistribution structure layer is electrically connected to the first pads and the bridge pads of the bridge. A second redistribution structure layer is formed on the lower surface of the interposer. The second redistribution structure layer is electrically connected to the second pads. Multiple chips are disposed on the first redistribution structure layer. The chips are electrically connected to the first redistribution structure layer. The chips are electrically connected to each other through the bridge.

In an embodiment of the disclosure, the step of embedding the bridge in the interposer includes the following steps. The bridge is disposed on a temporary substrate. The bridge pads face the temporary substrate. The intermediate layer is formed on the temporary substrate. The intermediate layer covers the bridge. The temporary substrate is removed to expose the upper surface of the intermediate layer. Multiple vias penetrating the intermediate layer are formed. The conductive vias, the first pads, and the second pads are formed on the intermediate layer. The conductive vias are respectively located in the vias and connect the first pads and the second pads.

In an embodiment of the disclosure, the manufacturing method of the package structure further includes the following step. Multiple chip pads electrically connected to the first redistribution structure layer are formed on the first redistribution structure layer after forming the first redistribution structure layer on the upper surface of the interposer.

In an embodiment of the disclosure, before disposing the chips on the first redistribution structure layer, the manufacturing method further includes the following steps. Multiple copper pillars are respectively formed on the chips. Multiple solders are respectively formed on the copper pillars. The copper pillars are located between the chips and the solders. The chips are electrically connected to the bridge through the copper pillars and the solders. Multiple solder balls are formed on the chips. The chips are electrically connected to the first redistribution structure layer through the solder balls.

In an embodiment of the disclosure, the manufacturing method of the package structure further includes the following steps. Multiple solder ball pads electrically connected to the second redistribution structure layer are formed on the second redistribution structure layer after forming the second redistribution structure layer on the lower surface of the interposer. Multiple solder balls are respectively formed on the solder ball pads.

In an embodiment of the disclosure, the bridge is formed by singulated cutting of a wafer.

Based on the above, in the design of the package structure of the disclosure, the bridge having the redistribution circuit layer and the bridge pads is embedded in the interposer, and the bridge pads are aligned with the upper surface of the intermediate layer. Therefore, the first redistribution structure layer subsequently formed on the interposer may have better flatness. In addition, when the chips are subsequently bonded onto the first redistribution structure layer in a flip-chip manner, each chip may not only be electrically connected to an external circuit through the first redistribution structure layer, the interposer, and the second redistribution circuit layer, two chips may also be electrically connected to each other through the bridge, so as to achieve partial or local high-density interconnection. In short, the package structure of the disclosure can have better structural reliability (due to flatness) and chip-to-chip interconnect densities in a way that is cost-effective.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1A:
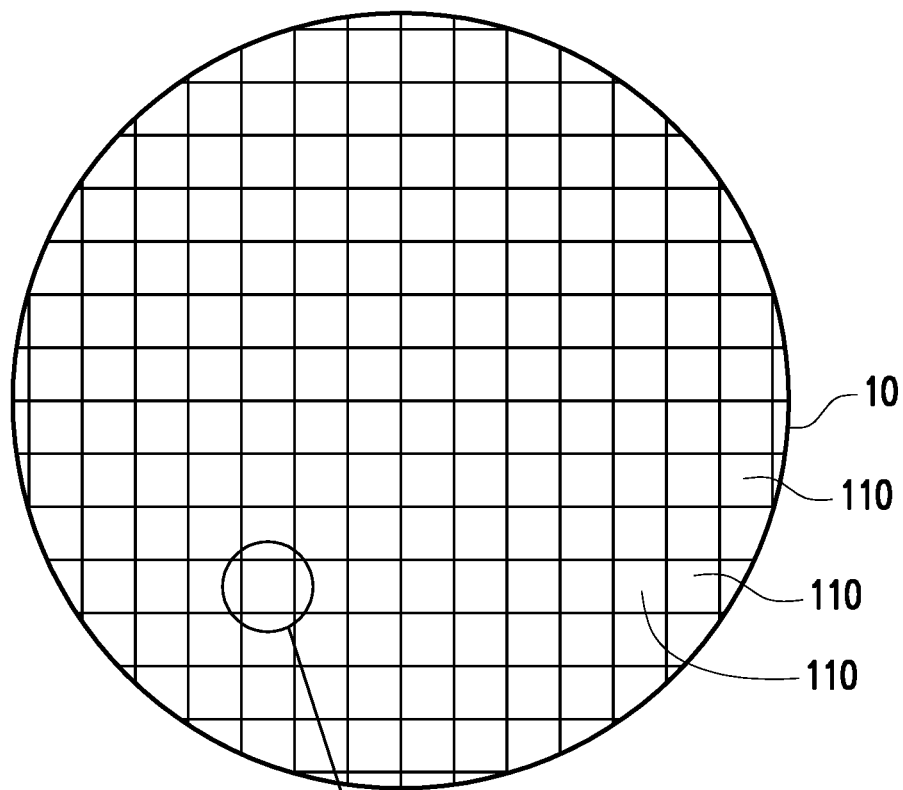
FIG. 1A to FIG. 1J are schematic diagrams of a manufacturing method of a package structure according to an embodiment of the disclosure.

FIG. 1A to FIG. 1J are schematic diagrams of a manufacturing method of a package structure according to an embodiment of the disclosure. For the convenience of description, FIG. 1A is shown as a simple top view, and FIG. 1B to FIG. 1J are shown as cross-sectional views.

Figure 1B:
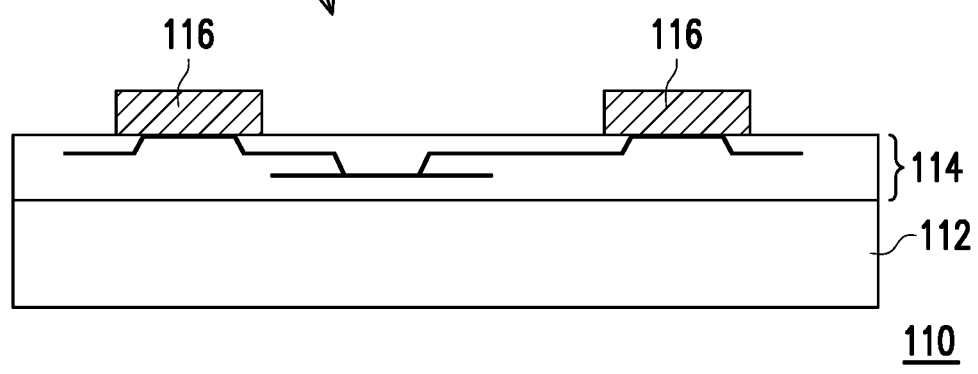

Regarding the manufacturing method of the package structure of this embodiment, firstly, please refer to FIG. 1A and FIG. 1B at the same time. A bridge 110 is provided. The bridge 110 includes a silicon substrate 112, a redistribution circuit layer 114, and multiple bridge pads 116. The redistribution circuit layer 114 is disposed on the silicon substrate 112. The bridge pads 116 are disposed on the redistribution circuit layer 114 and are electrically connected to the redistribution circuit layer 114. Here, the bridge 110 is embodied by singulated cutting of a wafer 10. The redistribution circuit layer 114 is manufactured by adopting a 64-nanometer process technology, the number of circuit layers of the redistribution circuit layer 114 is 2 layers to 4 layers, and the minimum pitch of the circuit is 0.4 microns. Preferably, the size of the bridge 110 is 3 millimeters times 3 millimeters, which means that the size is very small.

Figure 1C:
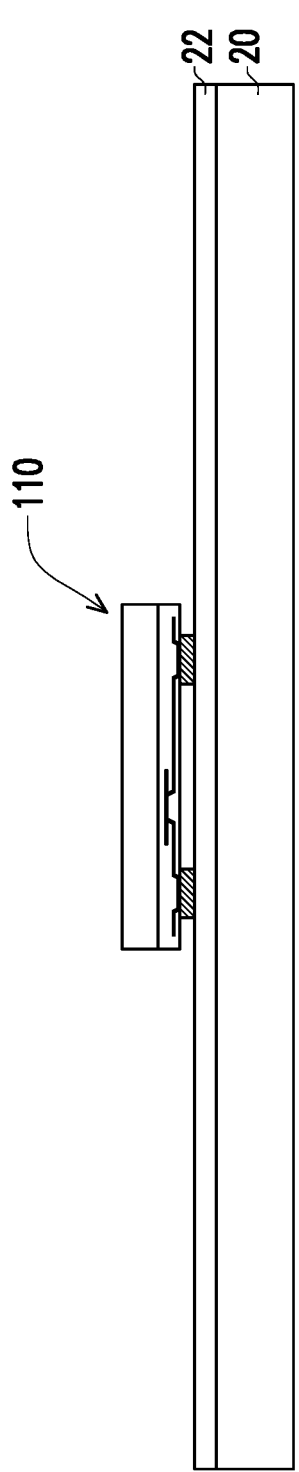
Figure 1D:
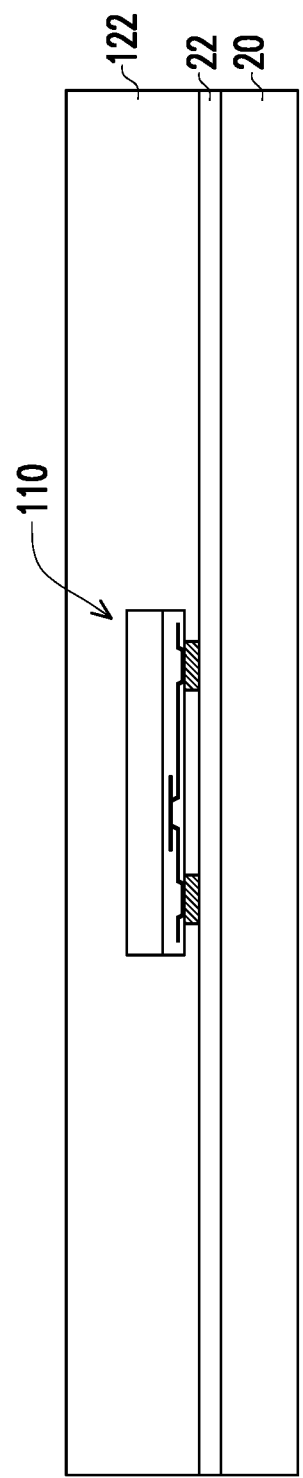
Figure 1E:
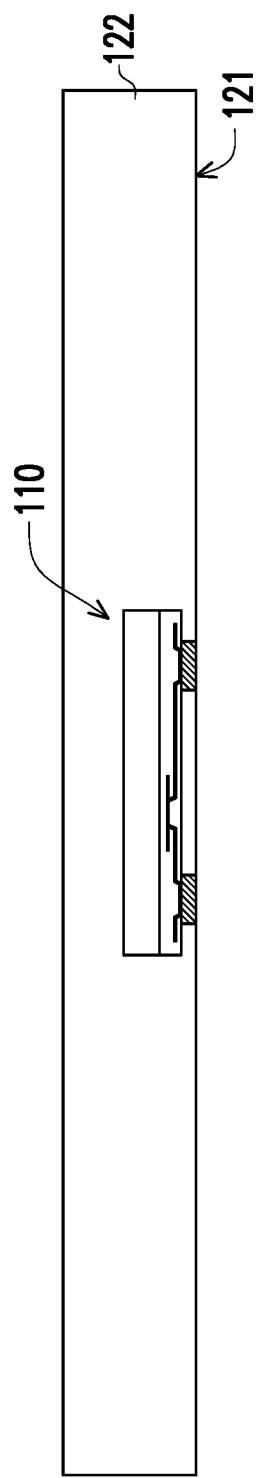
Figure 1F:
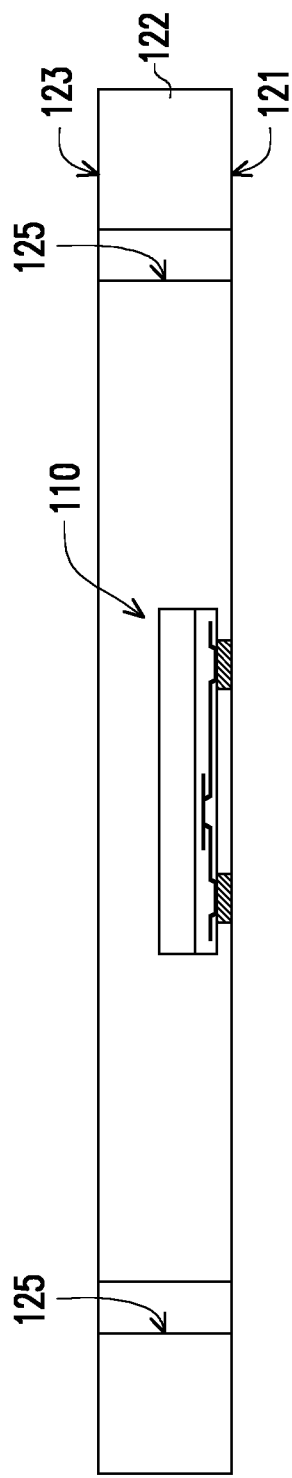
Figure 1G:
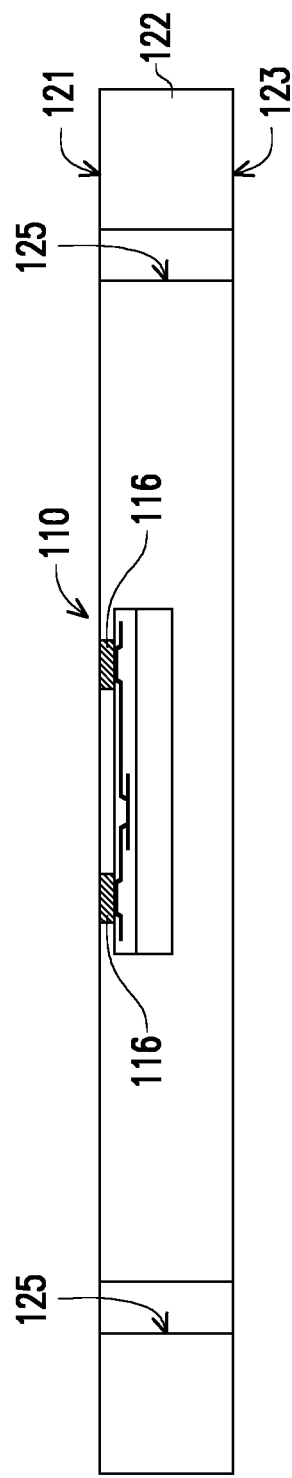
Figure 1H:
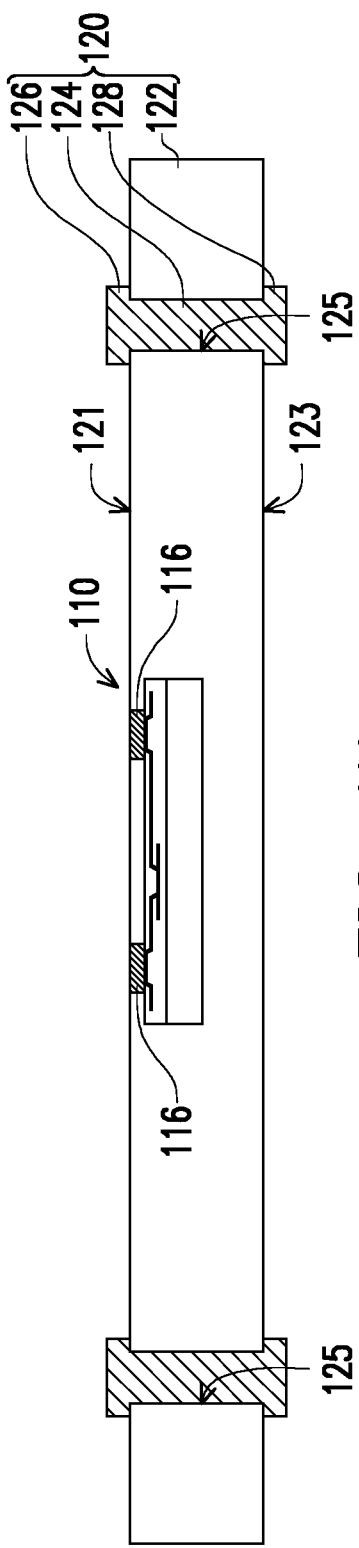

Next, please refer to FIG. 1H first. The bridge 110 is embedded in an interposer 120. The interposer 120 includes an intermediate layer 122, multiple conductive vias 124, multiple first pads 126, and multiple second pads 128. The intermediate layer 122 has an upper surface 121 and a lower surface 123 opposite to each other. The conductive vias 124 penetrate the intermediate layer 122 and are respectively connected to the first pads 126 located on the upper surface 121 and the second pads 128 located on the lower surface 123. In particular, the bridge pads 116 of the bridge 110 are substantially aligned with the upper surface 121 of the intermediate layer 122.

In detail, in the step of embedding the bridge 110 in the interposer 120, firstly, please refer to FIG. 1C. The bridge 110 is disposed on a temporary substrate 20. The bridge pads 116 face the temporary substrate 20. Here, a release film 22 is also disposed on the temporary substrate 20. The temporary substrate 20 is, for example, a glass substrate or a steel substrate either round or rectangular structure. The bridge 110 is positioned on the temporary substrate 20 through the release film 22 in a face-down manner.

Next, please refer to FIG. 1D. The intermediate layer 122 is formed on the temporary substrate 20. The intermediate layer 122 covers the bridge 110. The material of the intermediate layer 122 is, for example, an Ajinomoto build-up film (ABF) or an epoxy molding compound (EMC), but not limited thereto.

Next, please refer to FIG. 1E. The temporary substrate 20 and the release film 22 are removed to expose the upper surface 121 of the intermediate layer 122.

Next, please refer to FIG. 1F. Through a laser drilling manner, multiple vias 125 penetrating the intermediate layer 122 are formed. The vias 125 penetrate the intermediate layer 122 and connect the upper surface 121 and the lower surface 123. The vias 125 are located on two sides of the bridge 110.

Next, please refer to FIG. 1G. The intermediate layer 122 is flipped, so that the upper surface 121 of the intermediate layer 122 faces upward. At this time, the bridge 110 is facing up, and the bridge pads 116 of the bridge 110 are still aligned with the upper surface 121 of the intermediate layer 122.

Next, please refer to FIG. 1H. The conductive vias 124, the first pads 126, and the second pads 128 are formed on the intermediate layer 122 by electroplating. The conductive vias 124 are respectively located in the vias 125. Two opposite ends of the conductive via 124 are respectively connected to the first pad 126 and the second pad 128.

Figure 1I:
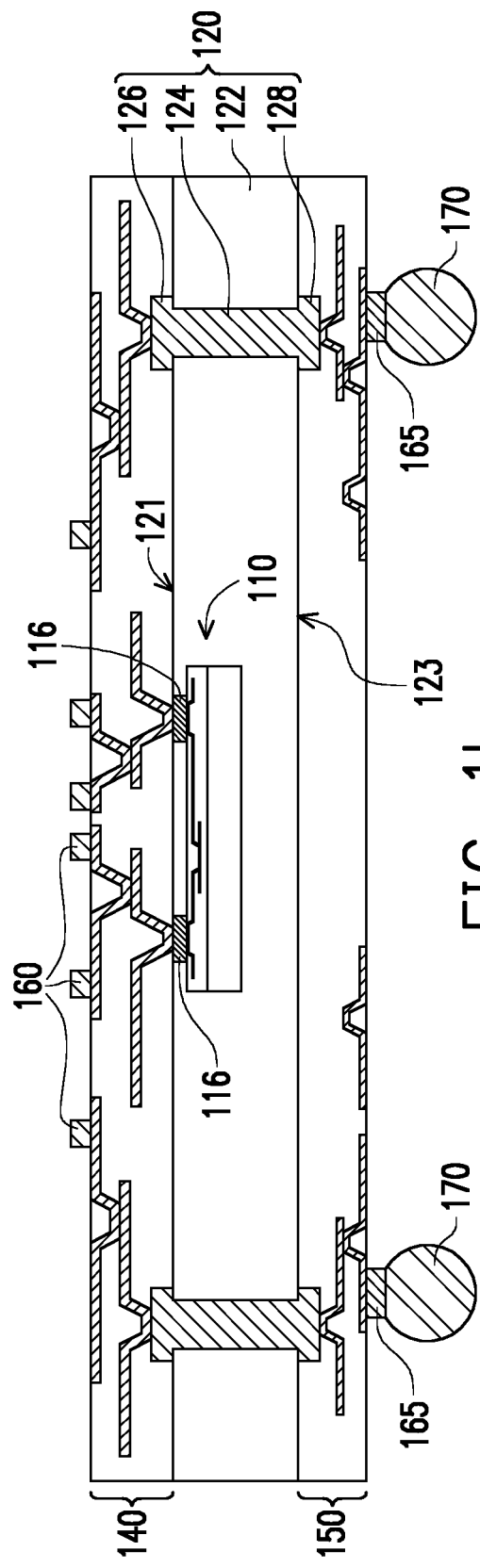
Figure 1J:
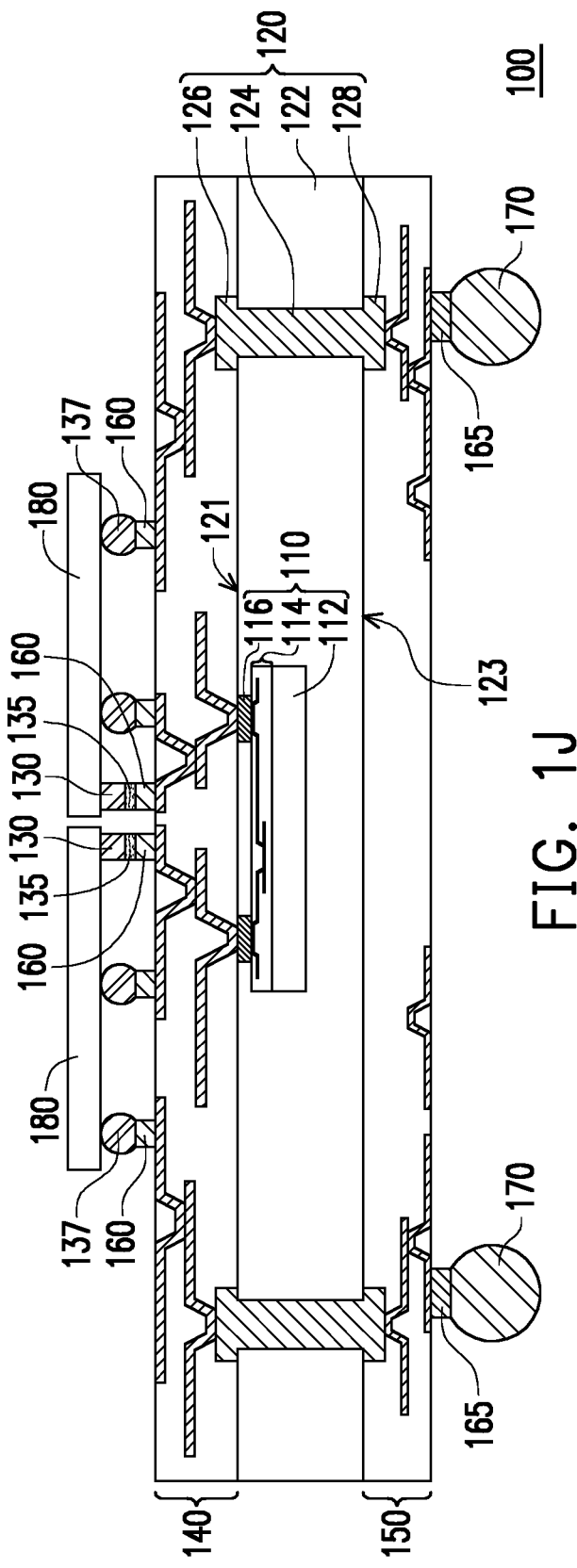

Next, please refer to FIG. 1I. A first redistribution structure layer 140 is formed on the upper surface 121 of the interposer 120. The first redistribution structure layer 140 is electrically connected to the first pads 126 and the bridge pads 116 of the bridge 110.

Next, please refer to FIG. 1I again. A second redistribution structure layer 150 is formed on the lower surface 123 of the interposer 120. The second redistribution structure layer 150 is electrically connected to the second pads 128.

Here, the sequence of forming the first redistribution structure layer 140 and the second redistribution structure layer 150 is not limited. For example, the first redistribution structure layer 140 may be formed first, and then the second redistribution structure layer 150 may be formed. Alternatively, the second redistribution structure layer 150 may be formed first, and then the first redistribution structure layer 140 may be formed. Alternatively, the first redistribution structure layer 140 and the second redistribution structure layer 150 may be formed at the same time.

After that, please refer to FIG. 1I again. Multiple chip pads 160 are formed on the first redistribution structure layer 140 and are electrically connected to the first redistribution structure layer 140. Next, multiple solder ball pads 165 are formed on the second redistribution structure layer 150 and are electrically connected to the second redistribution structure layer 150. Afterwards, multiple solder balls 170 respectively are formed on the solder ball pads 165. Here, the sequence of forming the chip pads 160 and the solder ball pads 165 is not limited.

Finally, please refer to FIG. 1J again. Multiple chips 180 are disposed on the first redistribution structure layer 140. The chips 180 are electrically connected to the first redistribution structure layer 140. The chips 180 are electrically connected to each other through the bridge 110. Here, the chips 180 may be different forms and types of chips, which is not limited here. Furthermore, before disposing the chips 180 on the first redistribution structure layer 140, multiple copper pillars 130 are respectively formed on the chips 180. Then, multiple solders 135 are respectively formed on the copper pillars 130. The copper pillars 130 are located between the chips 180 and the solders 135. Then, multiple solder balls 137 are formed on chips 180. The chips 180 are electrically connected to the first redistribution structure layer 140 through the solder balls 137. The chips 180 are electrically connected to the bridge 110 through the copper pillars 130 and the solders 135. So far, the manufacture of a package structure 100 has been completed.

In terms of structure, please refer to FIG. 1J again. The package structure 100 includes the bridge 110, the interposer 120, the first redistribution structure layer 140, the second redistribution structure layer 150, and the chips 180. The bridge 110 includes the silicon substrate 112, the redistribution circuit layer 114, and the bridge pads 116. The redistribution circuit layer 114 is disposed on the silicon substrate 112. The bridge pads 116 are disposed on the redistribution circuit layer 114 and are electrically connected to the redistribution circuit layer 114. The interposer 120 includes the intermediate layer 122, the conductive vias 124, the first pads 126, and the second pads 128. The intermediate layer 122 has the upper surface 121 and the lower surface 123 opposite to each other. The conductive vias 124 penetrate the intermediate layer 122 and are respectively connected to the first pads 126 located on the upper surface 121 and the second pads 128 located on the lower surface 123. The bridge 110 is embedded in the intermediate layer 122. The bridge pads 116 are aligned with the upper surface 121. The first redistribution structure layer 140 is disposed on the upper surface 121 of the interposer 120 and is electrically connected to the first pads 126 and the bridge pads 116 of the bridge 110. The second redistribution structure layer 150 is disposed on the lower surface 123 of the interposer 120 and is electrically connected to the second pads 128. The chips 180 are disposed on the first redistribution structure layer 140 and are electrically connected to the first redistribution structure layer 140. The chips 180 are electrically connected to each other through the bridge 110.

Furthermore, in this embodiment, the package structure 100 further includes the chip pads 160, the solder ball pads 165, and the solder balls 170. The chip pads 160 are disposed on the first redistribution structure layer 140 and are electrically connected to the first redistribution structure layer 140. The chips 180 may be electrically connected to the first redistribution structure layer 140 and the bridge 110 through the chip pads 160. The solder ball pads 165 are disposed on the second redistribution structure layer 150 and are electrically connected to the second redistribution structure layer 150. The solder balls 170 are respectively disposed on the solder ball pads 165. The package structure 100 may be electrically connected to an external circuit (such as a printed circuit board) through the solder balls 170.

In addition, the package structure 100 of this embodiment also includes the copper pillars 130, the solders 135, and the solder balls 137. The copper pillars 130 are respectively disposed on the chips 180. The solders 135 are respectively disposed on the copper pillars 130. The copper pillars 130 are respectively located between the chips 180 and the solders 135. The chips 180 are electrically connected to the bridge 110 through the copper pillars 130 and the solders 135. The solder balls 137 are disposed on the chips 180. The chips 180 are electrically connected to the first redistribution structure layer 140 through the solder balls 137.

In short, in this embodiment, the bridge 110 is first packaged in a face-down manner and is embedded in the interposer 120. After package molding the bridge 110, there is no need to adopt polishing and no need to electroplate the copper pillars. Therefore, the package structure 100 of this embodiment has the advantages of simple manufacturing process and low cost. Furthermore, since the bridge pads 116 of the bridge 110 are aligned with the upper surface 121 of the intermediate layer 122, the first redistribution structure layer 140 subsequently formed on the interposer 120 may have better flatness. In addition, when the chips 180 are subsequently bonded onto the first redistribution structure layer 140 in a flip-chip manner, each chip 180 may not only be electrically connected to the external circuit through the first redistribution structure layer 140, the interposer 120, and the second redistribution circuit layer 150, two chips 180 may also be electrically connected to each other through the bridge 110, so as to achieve partial or local high-density interconnection. In other words, the package structure 100 of this embodiment can have better surface flatness and chip-to-chip interconnect densities in a way that is cost-effective.

In summary, in the design of the package structure of the disclosure, the bridge having the redistribution circuit layer and the bridge pads is embedded in the interposer, and the bridge pads are aligned with the upper surface of the intermediate layer. Therefore, the first redistribution structure layer subsequently formed on the interposer may have better flatness. In addition, when the chips are subsequently bonded onto the first redistribution structure layer in a flip-chip manner, each chip may not only be electrically connected to the external circuit through the first redistribution structure layer, the interposer, and the second redistribution circuit layer, two chips may also be electrically connected to each other through the bridge, so as to achieve partial or local high-density interconnection. In short, the package structure of the disclosure can have better surface flatness and higher density interconnects that are cost-effective.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:
1. A package structure, comprising:
   a bridge, comprising a silicon substrate, a redistribution circuit layer, and a plurality of bridge pads, wherein the redistribution circuit layer is disposed on the silicon substrate, and the bridge pads are disposed on the redistribution circuit layer and are electrically connected to the redistribution circuit layer;
an interposer, comprising an intermediate layer, a plurality of conductive vias, a plurality of first pads, and a plurality of second pads, wherein the intermediate layer has an upper surface and a lower surface opposite to each other, the conductive vias penetrate the intermediate layer and are respectively connected to the first pads located on the upper surface and the second pads located on the lower surface, wherein the bridge is embedded in the intermediate layer, and the bridge pads are aligned with the upper surface;
a first redistribution structure layer, disposed on the upper surface of the interposer and electrically connected to the first pads and the bridge pads of the bridge;
a second redistribution structure layer, disposed on the lower surface of the interposer and electrically connected to the second pads; and
a plurality of chips, disposed on the first redistribution structure layer and electrically connected to the first redistribution structure layer, wherein the chips are electrically connected to each other through the bridge.

2. The package structure according to claim 1, further comprising:
a plurality of chip pads, disposed on the first redistribution structure layer and electrically connected to the first redistribution structure layer, wherein the chips are electrically connected to the first redistribution structure layer and the bridge through the chip pads.

3. The package structure according to claim 1, further comprising:
a plurality of copper pillars, respectively disposed on the chips;
a plurality of solders, respectively disposed on the copper pillars, wherein the copper pillars are respectively located between the chips and the solders, and the chips are electrically connected to the bridge through the copper pillars and the solders; and
a plurality of solder balls, disposed on the chips, wherein the chips are electrically connected to the first redistribution structure layer through the solder balls.

4. The package structure according to claim 1, further comprising:
a plurality of solder ball pads, disposed on the second redistribution structure layer and electrically connected to the second redistribution structure layer; and
a plurality of solder balls, respectively disposed on the solder ball pads.

5. A manufacturing method of a package structure, comprising:
providing a bridge, comprising a silicon substrate, a redistribution circuit layer, and a plurality of bridge pads, wherein the redistribution circuit layer is disposed on the silicon substrate, and the bridge pads are disposed on the redistribution circuit layer and are electrically connected to the redistribution circuit layer;
embedding the bridge in an interposer, the interposer comprises an intermediate layer, a plurality of conductive vias, a plurality of first pads, and a plurality of second pads, the intermediate layer has an upper surface and a lower surface opposite to each other, the conductive vias penetrate the intermediate layer and are respectively connected to the first pads located on the upper surface and the second pads located on the lower surface, and the bridge pads are aligned with the upper surface;
forming a first redistribution structure layer on the upper surface of the interposer, wherein the first redistribution structure layer is electrically connected to the first pads and the bridge pads of the bridge;
forming a second redistribution structure layer on the lower surface of the interposer, wherein the second redistribution structure layer is electrically connected to the second pads; and
disposing a plurality of chips on the first redistribution structure layer, wherein the chips are electrically connected to the first redistribution structure layer, and the chips are electrically connected to each other through the bridge.

6. The manufacturing method of the package structure according to claim 5, wherein the step of embedding the bridge in the interposer comprises:
disposing the bridge on a temporary substrate, wherein the bridge pads face the temporary substrate;
forming the intermediate layer on the temporary substrate, wherein the intermediate layer covers the bridge;
removing the temporary substrate to expose the upper surface of the intermediate layer;
forming a plurality of vias penetrating the intermediate layer; and
forming the conductive vias, the first pads, and the second pads on the intermediate layer, wherein the conductive vias are respectively located in the vias and connect the first pads and the second pads.

7. The manufacturing method of the package structure according to claim 5, further comprising:
forming a plurality of chip pads electrically connected to the first redistribution structure layer on the first redistribution structure layer after forming the first redistribution structure layer on the upper surface of the interposer.

8. The manufacturing method of the package structure according to claim 5, wherein before disposing the chips on the first redistribution structure layer, the manufacturing method further comprises:
respectively forming a plurality of copper pillars on the chips;
respectively forming a plurality of solders on the copper pillars, wherein the copper pillars are located between the chips and the solders, and the chips are electrically connected to the bridge through the copper pillars and the solders; and
forming a plurality of solder balls on the chips, wherein the chips are electrically connected to the first redistribution structure layer through the solder balls.

9. The manufacturing method of the package structure according to claim 5, further comprising:
forming a plurality of solder ball pads electrically connected to the second redistribution structure layer on the second redistribution structure layer after forming the second redistribution structure layer on the lower surface of the interposer; and
respectively forming a plurality of solder balls on the solder ball pads.

10. The manufacturing method of the package structure according to claim 5, wherein the bridge is formed by singulated cutting of a wafer.

* * * * *